United States Patent
Lee et al.

(10) Patent No.: US 12,362,147 B2
(45) Date of Patent: Jul. 15, 2025

(54) APPARATUS FOR TREATING SUBSTRATE

(71) Applicants: SEMES CO., LTD., Cheonan-si (KR); PUSAN NATIONAL UNIVERSITY INDUSTRY-UNIVERSITY COOPERATION FOUNDATION, Busan (KR)

(72) Inventors: Sang Jeong Lee, Hwaseong-si (KR); Yoon Seok Choi, Suwon-si (KR); Sun Wook Jung, Hwaseong-si (KR); Ho-Jun Lee, Busan (KR); Sang Woo Kim, Busan (KR)

(73) Assignees: SEMES CO., LTD, Chungcheongnam-Do (KR); PUSAN NATIONAL UNIVERSITY INDUSTRY-UNIVERSITY COOPERATION FOUNDATION, Busan (KR)

( * ) Notice: Subject to any disclaimer, the term of this patent is extended or adjusted under 35 U.S.C. 154(b) by 205 days.

(21) Appl. No.: 18/056,046

(22) Filed: Nov. 16, 2022

(65) Prior Publication Data
US 2023/0207272 A1    Jun. 29, 2023

(30) Foreign Application Priority Data
Dec. 28, 2021  (KR) .................. 10-2021-0190310

(51) Int. Cl.
*H01J 37/32*   (2006.01)

(52) U.S. Cl.
CPC .. *H01J 37/32201* (2013.01); *H01J 37/32229* (2013.01); *H01J 37/3244* (2013.01)

(58) Field of Classification Search
CPC .............. H01J 37/3222; H01J 37/3244; H01J 37/32201; H01J 37/32192; H01J 37/32229; H01J 37/32238
See application file for complete search history.

(56) References Cited

U.S. PATENT DOCUMENTS

| | | | |
|---|---|---|---|
| 2002/0050486 A1* | 5/2002 | Ishii | H01J 37/32229 219/121.52 |
| 2003/0168008 A1* | 9/2003 | Ohmi | H01J 37/32229 118/715 |

(Continued)

FOREIGN PATENT DOCUMENTS

| | | |
|---|---|---|
| JP | H05-036640 A | 2/1993 |
| JP | 2000-040600 A | 2/2000 |

(Continued)

OTHER PUBLICATIONS

Korean Office Action dated Apr. 8, 2024 issued in corresponding Korean Appln. No. 10-2021-0190310.

(Continued)

*Primary Examiner* — Tung X Le
(74) *Attorney, Agent, or Firm* — Harness, Dickey & Pierce, P.L.C.

(57) ABSTRACT

An exemplary embodiment of the present invention provided an apparatus for treating a substrate. The apparatus for treating the substrate includes a process chamber having a treating space therein, a support unit for supporting the substrate in the treating space, gas supply unit for supplying treating gas to the treating space, and a microwave application unit for applying microwaves to the treating gas to generate plasma, wherein the microwave application unit includes a transmission plate disposed above the support unit to radiate the microwaves to the treating space, a first waveguide disposed above the transmission plate, and a first power supply for applying the microwaves to the first waveguide, wherein the first waveguide is provided in a ring shape.

16 Claims, 12 Drawing Sheets

(56) References Cited

U.S. PATENT DOCUMENTS

| | | | | |
|---|---|---|---|---|
| 2006/0137613 A1* | 6/2006 | Kasai | ................ | H01J 37/32192 |
| | | | | 118/723 ME |
| 2009/0314629 A1* | 12/2009 | Nishimoto | .......... | H01J 37/3222 |
| | | | | 422/186.04 |
| 2010/0230387 A1* | 9/2010 | Okesaku | ........... | C23C 16/45568 |
| | | | | 427/575 |
| 2015/0170881 A1* | 6/2015 | Komatsu | ........... | H01J 37/32238 |
| | | | | 118/723 AN |
| 2017/0330727 A1 | 11/2017 | Lee et al. | | |
| 2017/0356084 A1* | 12/2017 | Nakanishi | ............. | C23C 16/511 |
| 2019/0198296 A1* | 6/2019 | Lu | ..................... | H01J 37/32834 |

FOREIGN PATENT DOCUMENTS

| | | |
|---|---|---|
| JP | 2008-071894 A | 3/2008 |
| JP | 2008-108796 A | 5/2008 |
| JP | 2014-229752 A | 12/2014 |
| KR | 100744590 B1 | 8/2007 |
| KR | 10-2008-0029844 A | 4/2008 |
| KR | 10-2021-0134601 A | 11/2021 |

OTHER PUBLICATIONS

Japanese Office Action dated Jan. 16, 2024 issued in corresponding Japanese Patent Application No. 2022-204716.

* cited by examiner

APPARATUS FOR TREATING SUBSTRATE

CROSS-REFERENCE TO RELATED APPLICATIONS

This application claims priority to and the benefit of the Korean Patent Application No. 10-2021-0190310 filed in the Korean Intellectual Property Office on Dec. 28, 2021, the entire contents of which are incorporated herein by reference.

TECHNICAL FIELD

The present invention relates to an apparatus for treating a substrate, and more particularly, to an apparatus for treating a substrate of plasma-treating the substrate.

BACKGROUND ART

Plasma refers to an ionized gas state composed of ions, radicals, and electrons. The plasma is generated by very high temperatures, strong electric fields, or RF electromagnetic fields. In a semiconductor device manufacturing process, various processes are performed using plasma.

FIG. 1 is a diagram schematically illustrating a general substrate treating apparatus for treating a substrate using a microwave. Referring to FIG. 1, a substrate W is supported in a treating space 1001 of a process chamber 1000, and a treating gas supplied into the treating space 1001 is excited using microwaves to generate plasma, so that the substrate W is treated. An antenna plate 1100 having a slot 1102 is provided in an upper region of the substrate W. A dielectric plate 1200 is disposed above the antenna plate 1100, and a transmission plate 1300 is disposed below the antenna plate 1100. When the microwave is applied to the antenna plate 1100, the microwaves are transmitted along a radial direction of the antenna plate 1100 and then transmitted to the treating space 1001 through the slot 1102 and the transmission plate 1300.

When the substrate treating apparatus having the structure illustrated in FIG. 1 is used, structural complexity of components disposed above the treating space 1001 is accompanied. There are many space restrictions on the upper region of the treating space 1001. In addition, due to the structure of the antenna plate 1100, the dielectric plate 1200, and the transmission plate 1300, the treating gas cannot be supplied from the upper portion of the treating space 1001. Accordingly, the treating gas is not smoothly supplied into the treating space 1001, thereby impairing the uniformity of plasma formed in the treating space 1001.

In addition, the antenna plate 1100 has a thin thickness to smoothly transmit microwaves toward the transmission plate 1300. The microwaves transmitted to the antenna plate 1100 generate a current while passing through the slot 1102. Since the current is generated, the antenna plate 1100 is heated to cause thermal deformation in the upper structure. When a cooling structure is further installed to suppress heat generation, the structural complexity of the upper space is increased. When the heat generation is not suppressed, the antenna plate 1100 provided with a thin thickness may be deformed, so that the microwaves cannot be smoothly transmitted to the treating space 1001.

SUMMARY OF THE INVENTION

The present invention has been made in an effort to provide an apparatus for treating a substrate capable of efficiently treating the substrate.

The present invention has been also made in an effort to provide an apparatus for treating a substrate capable of minimizing the structural complexity of the substrate treating apparatus.

The present invention has been also made in an effort to provide an apparatus for treating a substrate capable of minimizing the deformation of members due to the heat generated in a process of transmitting microwaves.

The present invention has been also made in an effort to provide an apparatus for treating a substrate capable of supplying uniformly treating gas to a treating space where the substrate is to be treated.

The problem to be solved by the present invention is not limited to the above-mentioned problems, and the problems not mentioned will be clearly understood by those skilled in the art from the present specification and the accompanying drawings.

An exemplary embodiment of the present invention provides an apparatus for treating a substrate. The apparatus for treating the substrate includes a process chamber having a treating space therein, a support unit for supporting the substrate in the treating space, gas supply unit for supplying treating gas to the treating space, and a microwave application unit for applying microwaves to the treating gas to generate plasma, wherein the microwave application unit includes a transmission plate disposed above the support unit to radiate the microwaves to the treating space, a first waveguide disposed above the transmission plate, and a first power supply for applying the microwaves to the first waveguide, wherein the first waveguide may be provided in a ring shape.

In the exemplary embodiment, the first waveguide may be provided in an annular ring shape with respect to the center of the transmission plate, and connected to the first power supply at a position spaced apart from the center of the transmission plate, when viewed from the top.

In the exemplary embodiment, the first waveguide may be positioned to face an edge region of the transmission plate, and have a cut portion.

In the exemplary embodiment, the first power supply may be coupled to one surface of the first waveguide adjacent to the cut surface of the first waveguide.

In the exemplary embodiment, a plurality of first slots may be formed on a lower surface of the first waveguide, and the first slots may be spaced apart from each other along a circumferential direction of the first waveguide.

In the exemplary embodiment, the first slots may be disposed in a plurality of rows when viewing the first waveguide from a front cross section.

In the exemplary embodiment, the microwave application unit may further include a second waveguide disposed above the transmission plate in a region including the center of the transmission plate; and a second power supply configured to apply the microwaves to the second waveguide, wherein at least one or more second slots may be formed on a lower surface of the second waveguide.

In the exemplary embodiment, the intensity of the microwave applied from the first power supply to the first waveguide may be different from the intensity of the microwave applied from the second power supply to the second waveguide.

In the exemplary embodiment, a gas channel through which the treating gas flows may be formed in the transmission plate, and the gas channel may be formed at a position that does not overlap with the first waveguide and the second waveguide when viewed from the top.

In the exemplary embodiment, the first waveguide may be provided to surround a part of an upper edge region of the transmission plate, and the microwave application unit may further include a third waveguide provided to surround the other part of the upper edge region of the transmission plate and combined with the first waveguide to form an annular ring shape, and having a plurality of third slots formed on a lower surface thereof, and a third power supply configured to apply the microwaves to the third waveguide.

In the exemplary embodiment, the first waveguide may be provided with a metal material, and the transmission plate may be provided with a material containing quartz.

Another exemplary embodiment of the present invention provides an apparatus for treating a substrate. The apparatus for treating the substrate may include a chamber having a treating space formed therein, a support unit for supporting the substrate in the treating space, and a microwave application unit for applying microwaves to treating gas supplied to the treating space to generate plasma, wherein the microwave application unit may include a transmission plate disposed above the support unit and transmitting a first microwaves to the treating space, a first waveguide disposed above the transmission plate and in which the first microwave flows, and a first power supply for applying the first microwave to the first waveguide, wherein a plurality of first slots through which the first microwave flows may be formed as the transmission plate on a lower surface of the first waveguide, and the first slots may be spaced apart from each other along a circumferential direction of the first waveguide.

In the exemplary embodiment, the first slots may be disposed in a plurality of ring shapes.

In the exemplary embodiment, the first waveguide may be positioned to face an edge region of the transmission plate, and may have a cut portion to be provided in a discontinuous ring shape.

In the exemplary embodiment, the microwave application unit may further include a second waveguide disposed above the transmission plate in a region including the center of the transmission plate, and a second power supply for applying a second microwave to the second waveguide, wherein at least one or more second slots may be formed on a lower surface of the second waveguide.

In the exemplary embodiment, the first waveguide may be provided to surround a part of an upper edge region of the transmission plate, and the microwave application unit may further include a third waveguide provided to surround the other part of the upper edge region of the transmission plate and combined with the first waveguide to form an annular ring shape, and having a plurality of third slots formed on a lower surface thereof, and a third power supply for applying a third microwave to the third waveguide.

In the exemplary embodiment, the first waveguide, the second waveguide, and the third waveguide may be in surface contact with the upper surface of the transmission plate, respectively.

In the exemplary embodiment, a gas channel through which the treating gas flows may be formed in the transmission plate, and the gas channel may be formed at a position that does not overlap with the first waveguide, the second waveguide, and the third waveguide, when viewed from the top.

Yet another exemplary embodiment of the present invention provides an apparatus for treating a substrate. The apparatus for treating the substrate may include a process chamber having a treating space formed therein, a support unit for supporting the substrate in the treating space, a gas supply unit for supplying treating gas to the treating space, a transmission plate disposed above the support unit, a first waveguide disposed above the transmission plate and having a plurality of first slots formed on a lower surface thereof, a second waveguide disposed above the transmission plate in a region including the center of the transmission plate and having at least one or more second slots formed on a lower surface thereof, a first power supply for applying a first microwave to the first waveguide, and a second power supply for applying a second microwave to the second waveguide, wherein the first waveguide may have an annular ring shape with a cut portion.

In the exemplary embodiment, a gas channel through which the treating gas flows may be formed in the transmission plate, and the gas channel may be formed at a position that does not overlap with the first waveguide and the second waveguide when viewed from the top.

According to the exemplary embodiment of the present invention, it is possible to efficiently treat the substrate.

Further, according to the exemplary embodiment of the present invention, it is possible to minimize the structural complexity of the substrate treating apparatus.

Furthermore, according to the exemplary embodiment of the present invention, it is possible to minimize the deformation of the members due to the heat generated in a process of transmitting microwaves.

Furthermore, according to the exemplary embodiment of the present invention, it is possible to supply uniformly a treating gas to a treating space where the substrate is to be treated.

The effect of the present invention is not limited to the foregoing effects, and non-mentioned effects will be clearly understood by those skilled in the art from the present specification and the accompanying drawings.

DETAILED DESCRIPTION

Figure 1:
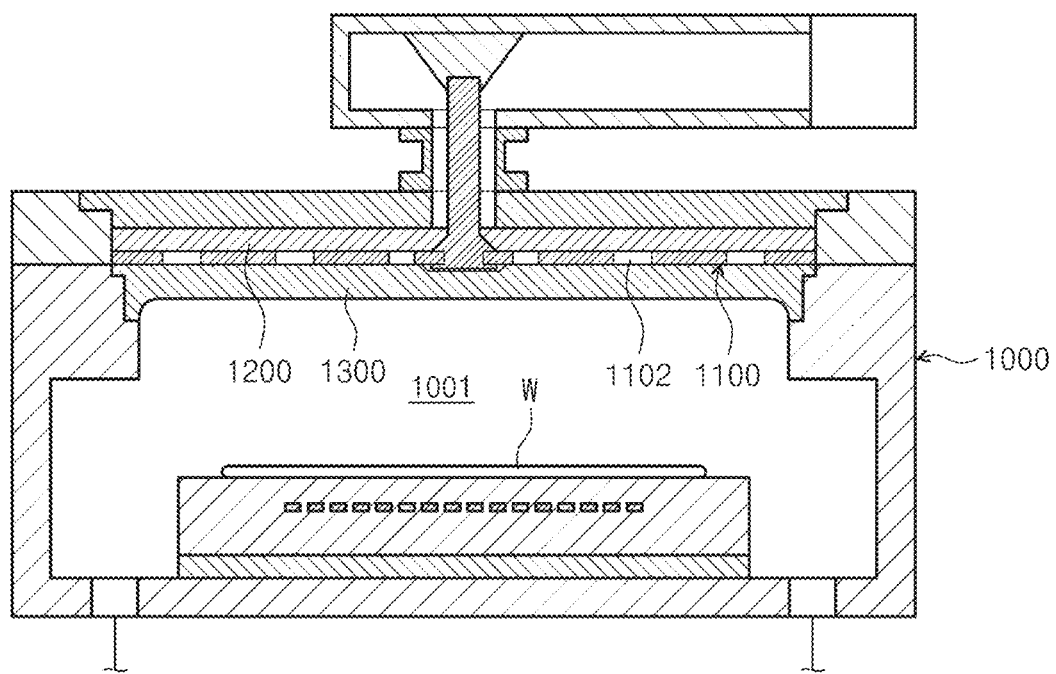
FIG. 1 is a diagram schematically illustrating a general substrate treating apparatus.

Hereinafter, exemplary embodiments of the present invention will be described in more detail with reference to the accompanying drawings. Exemplary embodiments of the present invention may be modified in various forms and should not be construed that the scope of the present invention is limited to exemplary embodiments to be described below. The exemplary embodiments will be provided for more completely explaining the present invention to those skilled in the art. Therefore, shapes, and the like of components in the drawings are exaggerated to emphasize a more clear description.

Terms, such as first and second, are used for describing various constituent elements, but the constituent elements are not limited by the terms. The terms are used only for distinguishing one component from the other component. For example, without departing from the scope of the invention, a first constituent element may be named as a second constituent element, and similarly a second constituent element may be named as a first constituent element.

Hereinafter, an exemplary embodiment of the present invention will be described in detail with reference to FIGS. 2 to 11.

Figure 2:
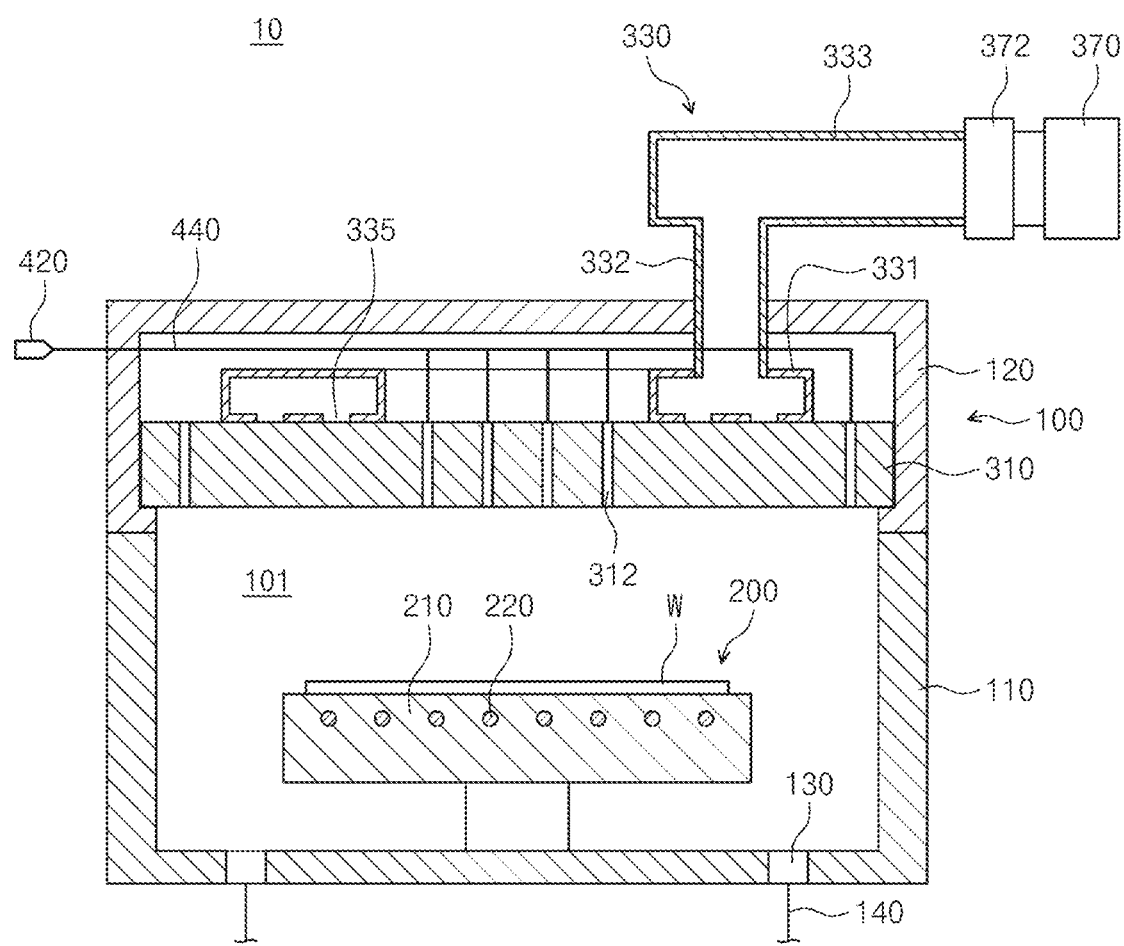
FIG. 2 is a diagram schematically illustrating a substrate treating apparatus according to an exemplary embodiment of the present invention.

FIG. 2 is a diagram schematically illustrating a substrate treating apparatus according to an exemplary embodiment of the present invention. Referring to FIG. 2, a substrate treating apparatus 10 treats a substrate W. The substrate treating apparatus 10 may treat the substrate W using plasma. For example, the substrate treating apparatus 10 may perform an etching process for removing a thin film on the substrate W using plasma, an ashing process for removing a photoresist film, a deposition process of forming a thin film on the substrate W, or a dry cleaning process.

Optionally, the substrate treating apparatus 10 may perform an annealing process on the substrate W using hydrogen plasma. However, the present invention is not limited thereto, and the plasma treating process performed by the substrate treating apparatus 10 may be variously modified into known plasma treating processes. The substrate W on which the treating process has been partially performed may be carried as the substrate W carried in the substrate treating apparatus 10. For example, the substrate W carried in the substrate treating apparatus 10 may be a substrate W on which an etching process, a photolithography process, or the like is performed.

The substrate treating apparatus 10 may include a process chamber 100, a support unit 200, a microwave application unit 300, and a plasma supply unit 400.

The process chamber 100 may include a body 110 and a cover 120. The body 110 has an opened upper surface and may have an inner space. For example, the body 110 may have an inner space and have a cylindrical shape with an opened upper surface. The cover 120 may be disposed on an upper end of the body 110. The cover 120 may seal the opened upper surface of the body 110. For example, the cover 120 may be provided in a cylindrical shape with an opened lower surface. The process chamber 100 may be defined by combining the body 110 and the cover 120 with each other. The cover 120 may be provided with a stepped inner side of a lower end so that an upper space has a larger radius than a lower space. An outer end of the transmission plate 310 to be described below may be disposed at the stepped portion inside the lower end of the cover 120.

The process chamber 100 has a treating space 101 therein. The treating space 101 is provided as a space formed by combining the body 110, the cover 120, and the transmission plate 310 to be described below with each other. The treating space 101 provides a space in which the substrate W is to be treated.

However, unlike the above-described example, the cover 120 may not be provided in the process chamber 100 according to an exemplary embodiment of the present invention. For example, the body 110 and the transmission plate 310 may be combined with each other to provide the treating space 101. The body 110 may have an opened upper surface, and the transmission plate 310 may seal the opened upper surface of the body 110. The outer end of the transmission plate 310 may be coupled to an outer upper end of the body 110 to define the treating space 101.

An opening (not illustrated) through which the substrate W is carried out from the treating space 101 or the substrate W is carried into the treating space 101 is formed in a side wall of the process chamber 100. The opening (not illustrated) may be selectively shielded by a door (not illustrated). For example, the opening (not illustrated) may be formed in one side wall of the body 110. The inner wall of process chamber 100 may be coated. For example, the inner wall of the process chamber 100 may be coated with a material including quartz.

An exhaust hole 130 is formed in a bottom surface of the process chamber 100. For example, the exhaust hole 130 may be formed in a bottom surface of the body 110. The exhaust hole 130 may be connected with an exhaust line 140. The exhaust line 140 discharges particles, process by-products, and the like flowing in the treating space 101. One end of the exhaust line 140 is connected to the exhaust hole 130, and the other end of the exhaust line 140 is connected to a decompression unit (not illustrated) providing a negative pressure. The decompression unit (not illustrated) may be a pump. However, the present invention is not limited thereto, and the decompression unit (not illustrated) may be provided to be variously modified as known devices for providing a negative pressure.

The support unit 200 may be positioned in the treating space 101. The support unit 200 may support the substrate W in the treating space 101. According to an exemplary embodiment, the support unit 200 may be an ESC capable of chucking the substrate W using an electrostatic force. Optionally, the support unit 200 may physically support the substrate W by mechanical clamping. Optionally, the support unit 200 does not provide a means for fixing the substrate W, and the substrate W may be disposed on the support unit 200.

The support unit 200 may include a body 210 and a heater 220. The body 210 supports the substrate W. An upper surface of the body 210 may be provided as a support surface for supporting the substrate W. The substrate W is seated on the upper surface of the body 210. The body 210 may be provided with a dielectric substance. The body 210 may be provided as a dielectric plate having a substantially disk shape. According to an exemplary embodiment, the diameter of the upper surface of the body 210 may be provided relatively larger than the diameter of the substrate W.

The heater 220 heats the substrate W. The heater 220 may heat the substrate W supported on the upper surface of the body 210. The heater 220 may heat the substrate W by increasing the temperature of the body 210. For example, the heater 220 may be provided as a heating element that generates heat by resisting an applied current. The heater 230 may be a heating element such as tungsten. However, a type of the heater 230 is not limited thereto, and may be provided to be variously modified as known heating elements.

The generated heat may be transmitted to the substrate W through the body 210. The substrate W may be maintained at a predetermined temperature required for the process by the heat generated in the heater 220. In addition, the heater 220 may increase the temperature of the body 210 so as to prevent impurities (e.g., an oxide film) separated from the substrate W from re-adhering to the substrate W while the substrate W is treated.

Although not illustrated, according to an exemplary embodiment, a plurality of heaters 220 may be provided as spiral coils. The heaters 220 may be provided in different regions of the body 210, respectively. For example, the heater 220 for heating a central region of the body 210 and the heater 220 for heating an edge region of the body 210 may be provided, respectively, and these heaters 220 may each independently adjust the degree of heat generation.

Figure 3:
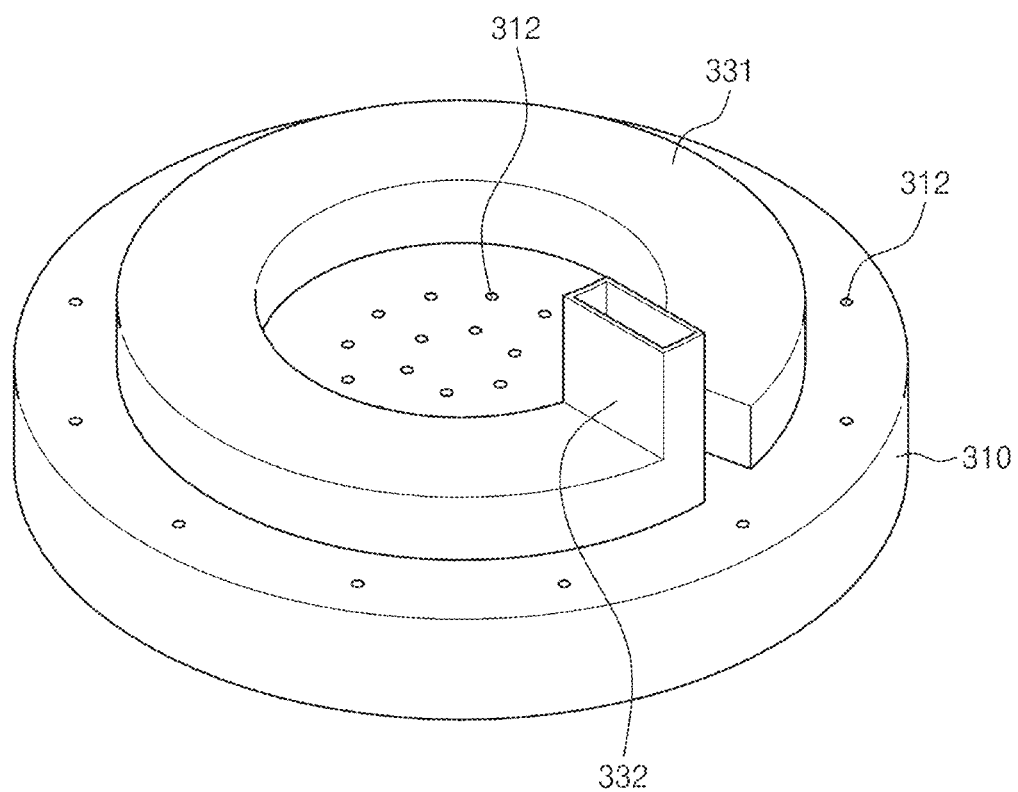
FIG. 3 is a perspective view schematically illustrating a transmission plate and a first waveguide according to the exemplary embodiment of FIG. 2.
Figure 4:
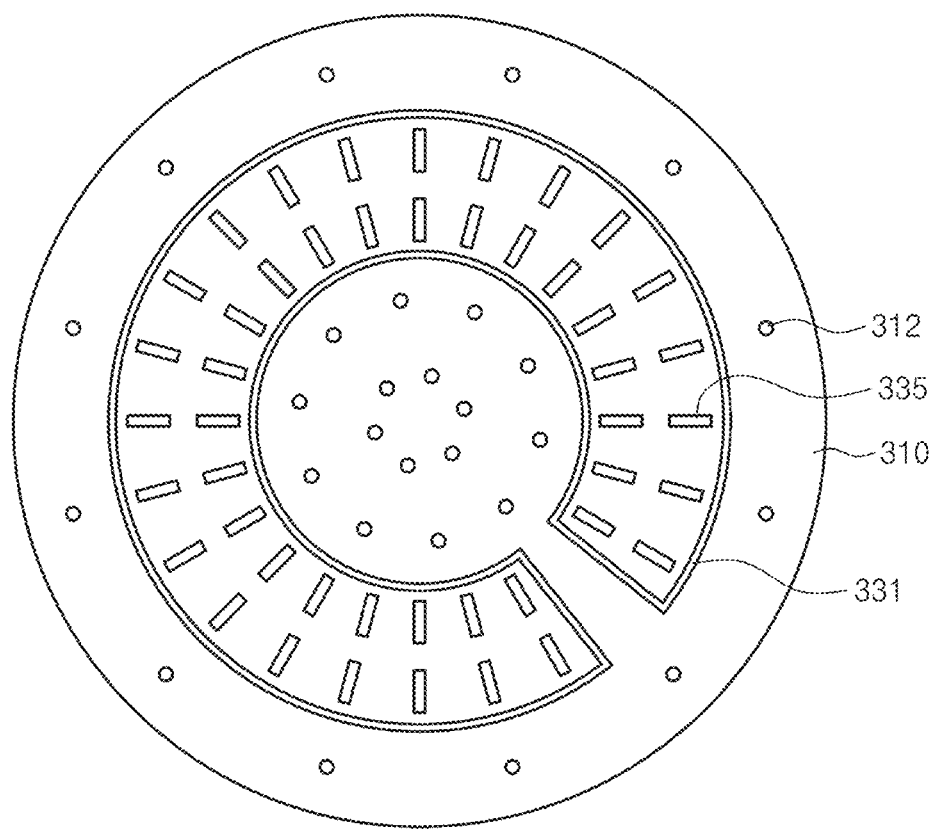
FIG. 4 is a diagram schematically illustrating the transmission plate and the first waveguide of FIG. 3 when viewed from the top.

FIG. 3 is a perspective view schematically illustrating a transmission plate and a first waveguide according to the exemplary embodiment of FIG. 2. FIG. 4 is a diagram schematically illustrating the transmission plate and the first waveguide of FIG. 3 when viewed from the top. Hereinafter, the microwave application unit according to an exemplary embodiment of the present invention will be described in detail with reference to FIGS. 2 to 4.

The microwave application unit 300 generates plasma in the treating space 101. The microwave application unit 300 may apply microwaves to treating gas supplied to the treating space 101 to excite the treating gas in the treating space 101. The microwave application unit 300 may include a transmission plate 310, a waveguide 320, and a power supply 360.

The transmission plate 310 is disposed above the support unit 200. The transmission plate 310 may be combined with the body 110 and the cover 120 to define the treating space 101. The transmission plate 310 functions as an upper wall of the treating space 101. The transmission plate 310 may be provided in a plate shape. For example, the transmission plate 310 may be provided in a substantially disk shape. An outer lower end of the transmission plate 310 may be disposed in a stepped space of the cover 120. Upper and lower surfaces of the transmission plate 310 may be provided flatly. However, the present invention is not limited thereto, and the upper surface of the transmission plate 310 is provided flatly, a central region of the lower surface of the transmission plate 310 is provided flatly, and an edge region of the lower surface of the transmission plate 310 may be formed to protrude downwards.

The transmission plate 310 is provided with a material that may transmit microwaves. The transmission plate 310 is provided with a material that radiates microwaves to the treating space 101. For example, the transmission plate 310 may be provided with a quartz material. Optionally, the transmission plate 310 may be provided with a dielectric material such as aluminum oxide (Al2O3), aluminum nitride (AlN), sapphire, or silicon nitride (SiN).

A gas channel 312 is formed in the transmission plate 310. The gas channel 312 may be provided as a groove penetrating from the upper end to the lower end of the transmission plate 310. The gas channel 312 may communicate with a gas line 440 to be described below. The treating gas supplied from the gas supply unit 400 to be described below sequentially passes through the gas line 440 and the gas channel 312 to be supplied to the treating space 101.

A plurality of gas channels 312 may be provided. The plurality of gas channels 312 may be formed in a region including the center of the transmission plate 310 and an edge region of the transmission plate 310. The plurality of gas channels 312 may be formed to be spaced apart from each other along a circumferential direction of the transmission plate 310. The plurality of gas channels 312 are formed at positions that do not overlap with the waveguide 320 to be described below when viewed from the top.

The waveguide 320 is disposed above the transmission plate 310. The waveguide 320 is positioned to be in contact with the transmission plate 310. For example, the lower surface of the waveguide 320 may be in surface contact with the upper surface of the transmission plate 310. The waveguide 320 may be provided with a metallic material. For example, the waveguide 320 may be provided with a material including copper or aluminum. An inner surface of the waveguide 320 is provided as a conductor. For example, the inner surface of the waveguide 320 may be provided with gold or silver. The waveguide 320 may be provided in a pipe shape with a polygonal cross section. The waveguide 320 has a passage formed therein. Microwaves applied from the power supply 360 to be described below may be transmitted to the transmission plate 310 through an internal passage of the waveguide 320.

The waveguide 320 may include a first waveguide 330. The first waveguide 330 may have a first portion 331, a second portion 332, and a third portion 333. The first portion 331, the second portion 332, and the third portion 333 may be integrally formed.

The first portion 331 may be provided in a ring shape. The first portion 331 may have an annular ring shape with respect to the center of the transmission plate 310. The first portion 331 may be disposed at a position facing the edge region of the transmission plate 310, when viewed from the top. The first portion 331 is formed with a cut part. The first portion 331 may be provided in a discontinuous ring shape.

A first slot 335 is formed on a bottom surface of the first portion 331. The first slot 335 may be provided as a through slit passing through the bottom surface of the first portion 331. Optionally, the first slot 335 may be filled with a material that transmits microwaves. A longitudinal direction of the first slot 335 may be formed in a direction from one side of the first portion 331 toward the other side facing one side.

A plurality of first slots 335 may be provided. The plurality of first slots 335 may be disposed to be spaced apart from each other along the circumferential direction of the first portion 331. The plurality of first slots 335 may be disposed in a plurality of rows when viewed from a front cross-section of the first portion 331. Accordingly, the plurality of first slots 335 may be arranged in a plurality of ring shapes in the first portion 331. Unlike illustrated the drawings, the plurality of first slots 335 may be arranged at different angles with respect to the center of the transmission plate 310.

The second portion 332 may extend from the first portion 331. For example, the second portion 332 may extend upwards from the upper surface of the first portion 331. The second portion 332 may be coupled to the upper surface of the first portion 331 at a position adjacent to the cut surface formed in the first portion 331.

The third portion 333 may extend from the second portion 332. For example, the third portion 333 may extend from the upper surface of the second portion 332 in a horizontal direction. The third portion 333 may be connected to a first power supply 370 to be described below.

The power supply 360 may include the first power supply 370 and a first matching network 372. The first power supply 370 generates a first microwave. For example, the first microwave generated by the first power supply 370 may have a frequency of approximately 2.3 GHz to 2.5 GHz. The first power supply 370 may be connected to the first waveguide 330. The first matching network 372 is provided in the third portion 333. The first matching network 372 is provided between the first power supply 370 and the second portion 332. The first matching network 372 may match the first microwave transmitted through the first power supply 370 with a predetermined frequency.

Figure 5A:
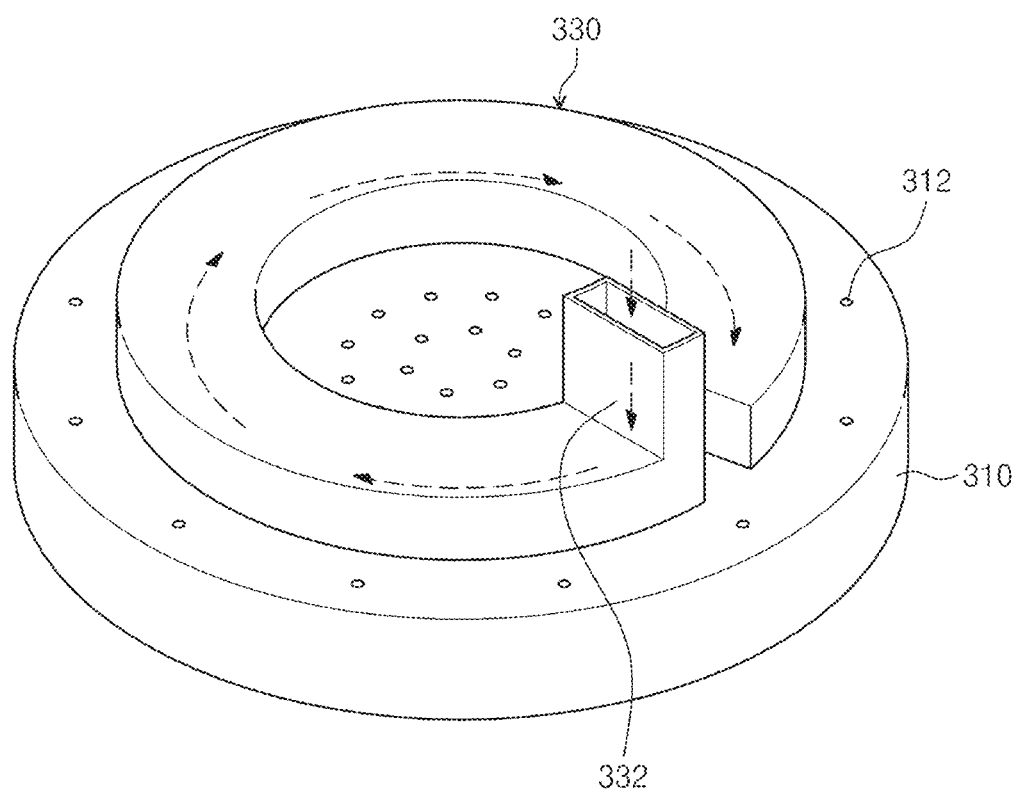
FIGS. 5A and 5B are diagrams schematically illustrating a state in which microwaves flow in the first waveguide and the transmission plate of FIG. 3.
Figure 5B:
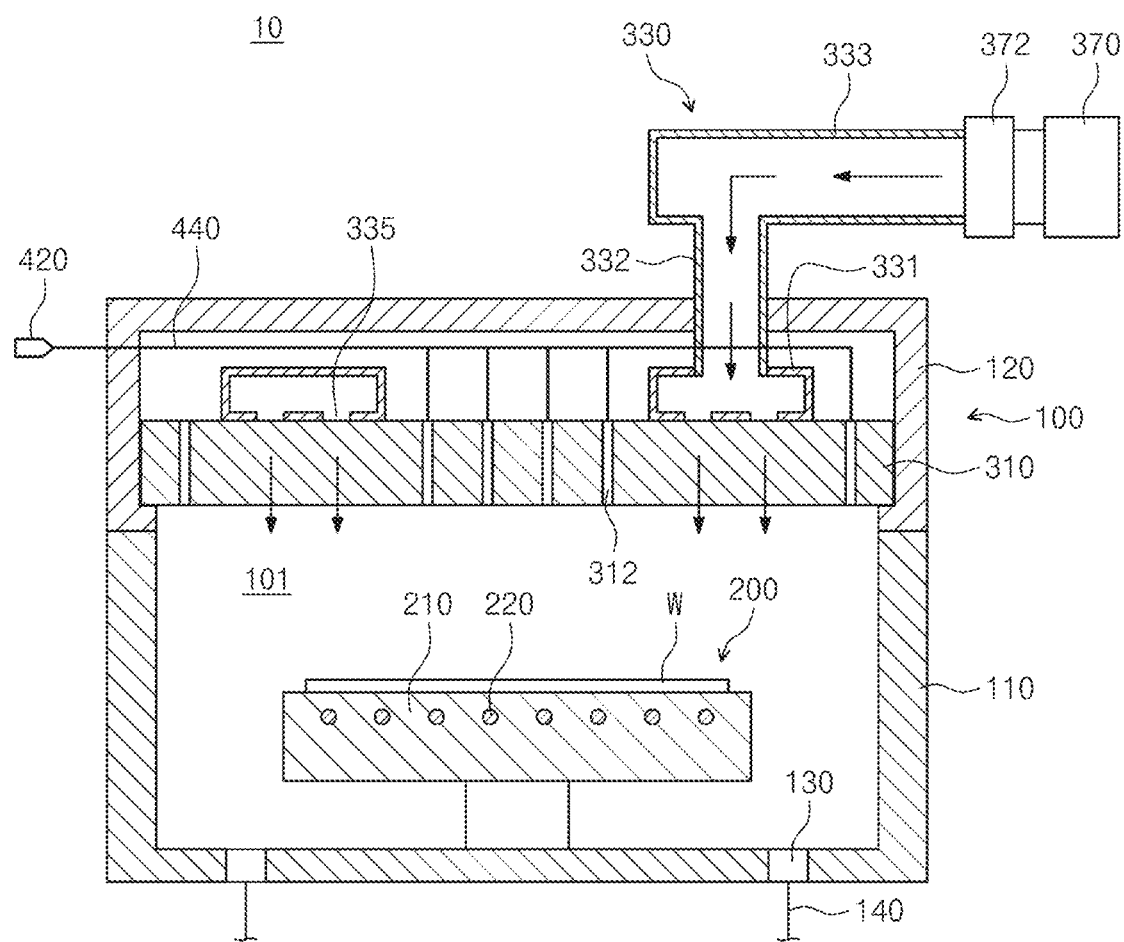

FIGS. 5A and 5B are diagrams schematically illustrating a state in which microwaves flow in the first waveguide and the transmission plate of FIG. 3. Referring to FIGS. 5A and 5B, the first microwave generated from the first power supply 370 may be transmitted to the first waveguide 330. The first microwave generated from the first power supply 370 may be transmitted to the first portion 331 through the first matching network 372, the third portion 333 of the first waveguide 330, and the second portion 332. The first microwave supplied to the first portion 331 may be transmitted to the cut portion of the first portion 331 along the first portion 331 formed in a ring shape. The first microwave is transmitted in an inner space of the first portion 331, and transmitted to the transmission plate 310 by passing through the first slot 335 formed on the lower surface of the first portion 331. The first microwave may be radiated from the transmission plate 310 to be transmitted to the treating space 101.

According to the exemplary embodiment of the present invention, the microwave application unit 300 may be provided to include the transmission plate 310 disposed above the treating space 101, the waveguide 320 disposed above the transmission plate 310, and the power supply 360 for transmitting microwaves to the waveguide 320. Accordingly, the waveguide 320 directly transmits the microwaves applied from the power supply 360 to the transmission plate 310, thereby minimizing the structural complexity of the upper region of the treating space 101 in which the microwave application unit 300 is disposed. That is, it is possible to provide the microwave application unit 300 that is integrally formed to transmit microwaves to the treating space 101 without installing a separate antenna member. In addition, unlike the general substrate treating apparatus described with reference to FIG. 1, the first slot 335 and the transmission plate 310 formed on the lower surface of the waveguide 320 serve as an existing antenna plate provided with a thin thickness, thereby minimizing the heat generated in the antenna plate. Accordingly, it is possible to minimize the thermal deformation of the microwave application unit 300 due to heat generated while the microwaves are transmitted. Accordingly, microwaves may be uniformly transmitted to the treating space 101, and plasma may be uniformly formed in the treating space 101.

Referring back to FIG. 2, the gas supply unit 400 supplies the treating gas to the treating space 101. The gas supply unit 400 may include a gas supply source 420 and a gas line 440. The gas supply source 420 may store and/or supply treating gas. The treating gas may include hydrogen. The gas line 440 is connected to the gas supply source 420 and the gas channel 312. One end of the gas line 440 may be connected to the gas supply source 420, and the other end of the gas line may communicate with the gas channel 312. The treating gas supplied from the gas supply unit 420 may be supplied to the treating space 101 through the gas line 440 and the gas channel 312. For example, the treating gas may be supplied toward the upper portion of the substrate W supported by the support unit 200.

In the above-described example, it has been described that the other end of the gas line 440 communicates with the gas channel 312 formed in the transmission plate 310 as an example. However, the present invention is not limited thereto, and the other end of the gas line 440 may be branched. The branched other end of the gas line 440 may be coupled to the gas channel 312 and one side wall of the process chamber 100, respectively. The other end of the gas channel 312 coupled to one side wall of the process chamber 100 may supply the treating gas toward the treating space 101 from a side surface of the treating space 101. The other end of the gas channel 312 may be coupled to a plurality of points along a circumferential direction of one side wall of the process chamber 100.

According to the embodiment of the present invention described above, the treating gas may be supplied toward the upper portion of the treating space 101 along the gas channel 312 formed in the transmission plate 310. Accordingly, it is possible to efficiently generate plasma applied to the substrate W in the treating space 101, and to improve the treating efficiency of the substrate W.

Figure 6:
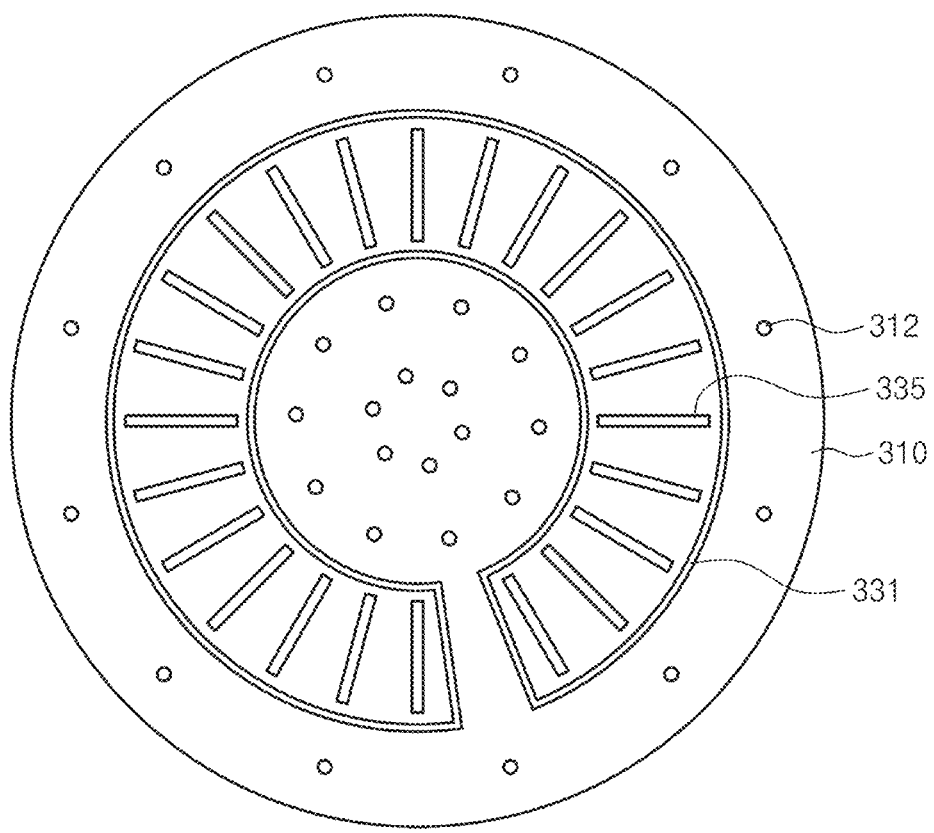
FIGS. 6 and 7 are diagrams schematically illustrating a first waveguide according to another exemplary embodiment of FIG. 2 when viewed from the top.
Figure 7:
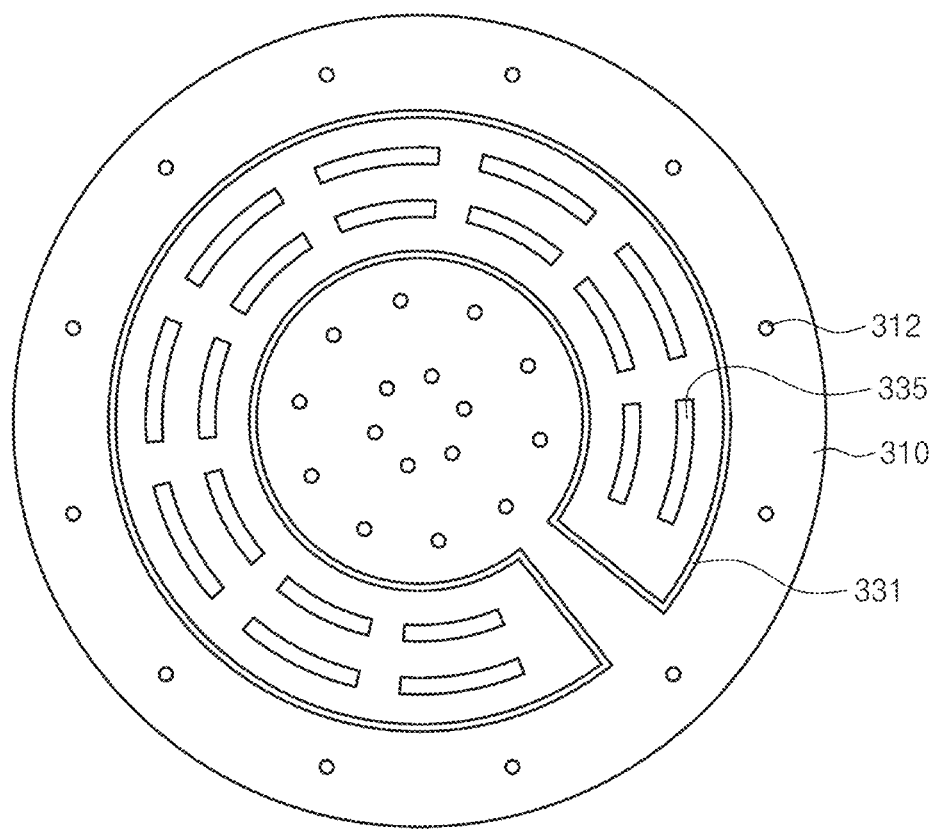

FIGS. 6 and 7 are diagrams schematically illustrating a first waveguide according to another exemplary embodiment of FIG. 2 when viewed from the top. The first waveguide according to an embodiment to be described below is provided in a structure mostly similar to that of the first waveguide described with reference to FIGS. 2 to 4 except for a case to be additionally described. Accordingly, the description of the duplicated configuration will be omitted.

Referring to FIG. 6, a first slot 335 is formed on a bottom surface of the first portion 331. The first slot 335 may be provided as a through slit passing through the upper and lower surfaces of the first portion 331. Optionally, the first slot 335 may be filled with a material that transmits microwaves. A longitudinal direction of the first slot 335 may be formed in a direction parallel with the other side surface facing one side surface from one side surface of the first portion 331. A plurality of first slots 335 may be provided. The plurality of first slots 335 may be disposed to be spaced apart from each other along the circumferential direction of the first portion 331. Unlike illustrated the drawings, the plurality of first slots 335 may be arranged at different angles with respect to the center of the transmission plate 310.

Referring to FIG. 7, the longitudinal direction of the first slot 335 formed on the bottom surface of the first portion 331 may be formed along the circumferential direction of the first portion 331. For example, the first slot 335 may have a longitudinal direction in a direction parallel to one side surface of the first portion 331. A plurality of first slots 335 may be provided. The plurality of first slots 335 may be disposed to be spaced apart from each other along the circumferential direction of the first portion 331. The plurality of first slots 335 may be disposed in a plurality of rows when viewed from a front cross-section of the first portion 331. Accordingly, the plurality of first slots 335 may be arranged in a plurality of ring shapes in the first portion 331. Unlike illustrated the drawings, the plurality of first slots 335 may be arranged at different angles with respect to the center of the transmission plate 310.

Figure 8:
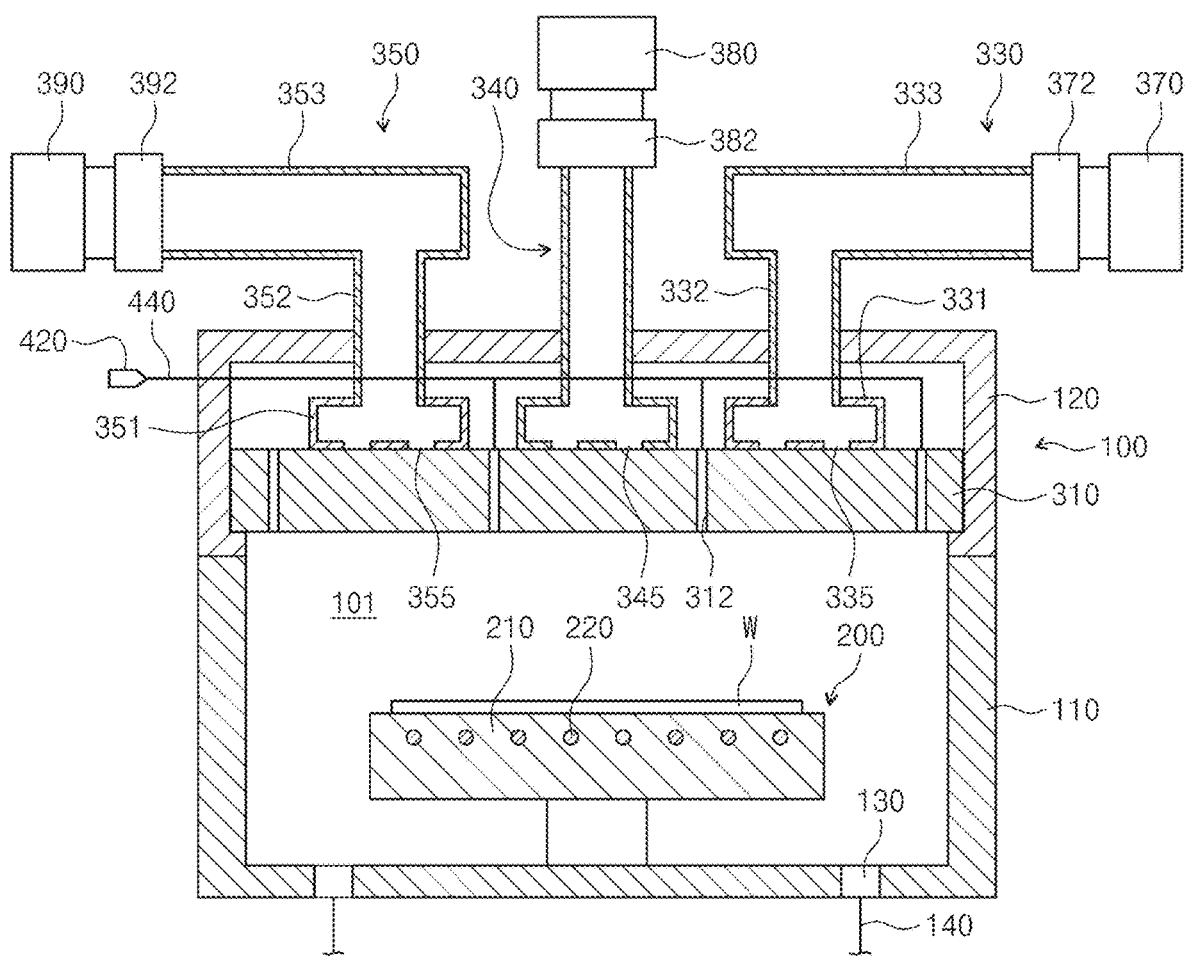
FIG. 8 is a diagram schematically illustrating a substrate treating apparatus according to another exemplary embodiment of the present invention.
Figure 9:
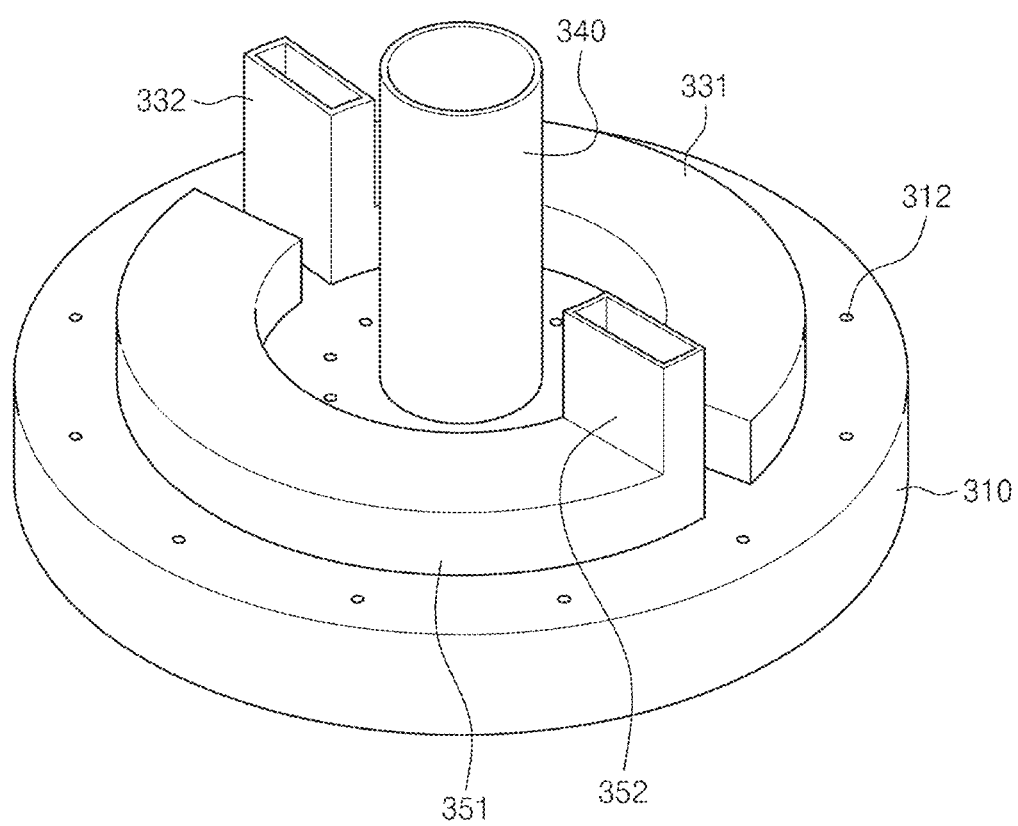
FIG. 9 is a perspective view schematically illustrating a transmission plate and a waveguide according to the exemplary embodiment of FIG. 8.

FIG. 8 is a diagram schematically illustrating a substrate treating apparatus according to another exemplary embodiment of the present invention. FIG. 9 is a perspective view schematically illustrating a transmission plate and a waveguide according to the exemplary embodiment of FIG. 8.

Figure 10:
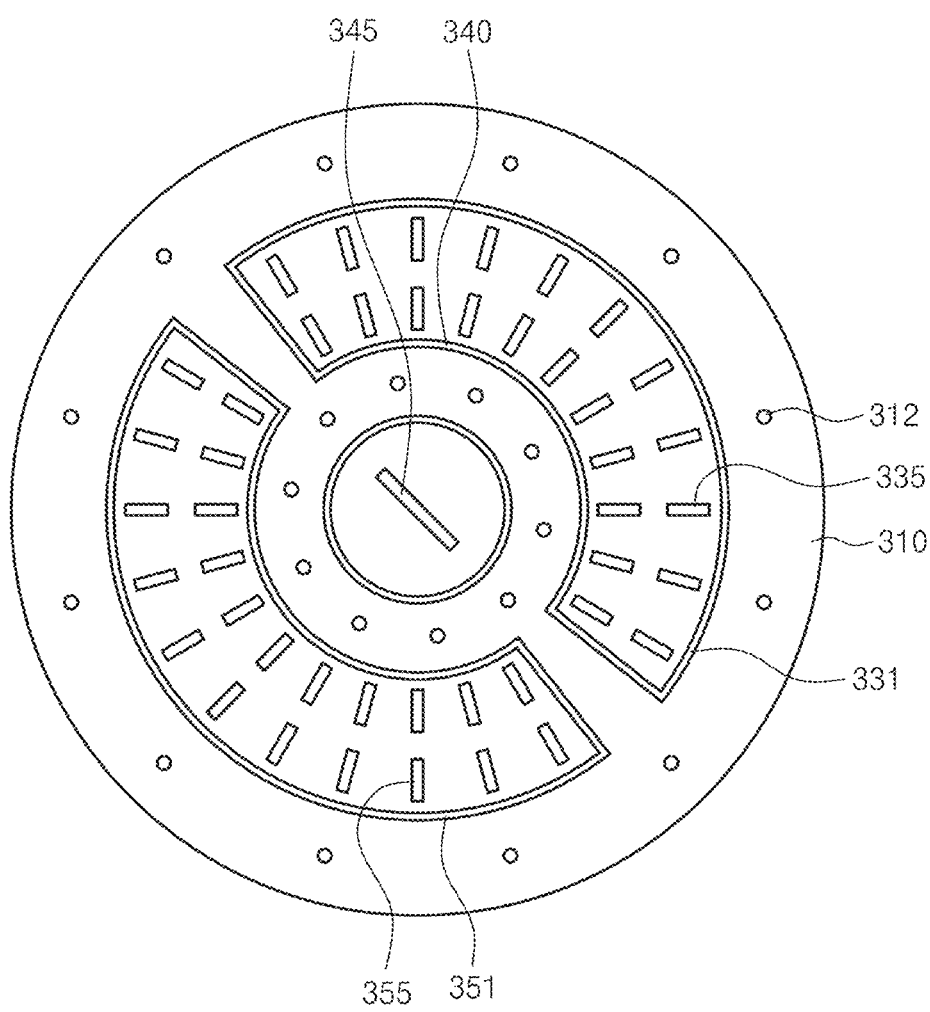
FIG. 10 is a diagram schematically illustrating the transmission plate and the waveguide of FIG. 9 when viewed from the top.

FIG. 10 is a diagram schematically illustrating the transmission plate and the waveguide of FIG. 9 when viewed from the top. Hereinafter, a substrate treating apparatus according to another exemplary embodiment of the present invention will be described in detail with reference to FIGS. 8 to 10.

The waveguide 320 may include a first waveguide 330, a second waveguide 340, and a third waveguide 350. The first waveguide 330 may have a first portion 331, a second portion 332, and a third portion 333. The first portion 331, the second portion 332, and the third portion 333 may be integrally formed.

The first portion 331 may be provided in a substantially ring shape. The first portion 331 may be provided in a cut ring shape. The first portion 331 may be provided in a semicircular shape at a position facing an edge region of the transmission plate 310 with respect to the center of the transmission plate 310. For example, the first portion 331 may be provided to surround a part of an upper edge region of the transmission plate 310. The second portion 332 extends from the first portion 331, and the third portion 333 extends from the second portion 332. Since the second portion 332 and the third portion 333 are provided mostly similar to the description of the second portion 332 and the third portion 333 described with reference to FIGS. 2 to 4, the description thereof will be omitted.

The second waveguide 340 may be disposed in a region including the center of the transmission plate 310. For example, the second waveguide 340 may be disposed on an upper surface of the region including the center of the transmission plate 310. The second waveguide 340 may be disposed to be spaced apart from the first waveguide 330 and the third waveguide 350 to be described below. A gas line 440 may be disposed in a space in which the first waveguide 330, the second waveguide 340, and the third waveguide 350 are spaced apart from each other. Accordingly, a gas channel 312 may be formed on an upper surface of the transmission plate 310 facing a position in which the first waveguide 330, the second waveguide 340, and the third waveguide 350 are spaced apart from each other. Accordingly, when viewed from the top, the gas channel 312 may be formed at a position that does not overlap with the first waveguide 330, the second waveguide 340, and the third waveguide 350.

The lower surface of the second waveguide 340 may be in surface contact with the upper surface of the transmission plate 310. A second slot 345 is formed on the lower surface of the second waveguide 340. The second slot 345 may pass through the lower surface of the second waveguide 340. Optionally, the second slot 345 may be filled with a material that transmits a second microwave to be described below. At least one or more second slots 345 may be provided. The second slot 345 may be provided at a position overlapping with the center of the substrate W supported by the support unit 200 when viewed from the top.

The third waveguide 350 may have a first portion 351, a second portion 352, and a third portion 353. The first portion 351, the second portion 352, and the third portion 353 may be integrally formed. The first portion 351 may be provided in a substantially ring shape. The first portion 351 may be provided in a cut ring shape. The first portion 351 may be provided in a semicircular shape at a position facing an edge region of the transmission plate 310 with respect to the center of the transmission plate 310. For example, the first portion 351 may be provided to surround the other part of an upper edge region of the transmission plate 310.

The first portion 351 of the third waveguide 350 may be combined with the first portion 331 of the first waveguide 330 to form a ring shape above the transmission plate 310. One end of the first portion 351 of the third waveguide 350 may be spaced apart from one end of the first portion 331 of the first waveguide 330 by a predetermined distance to face each other. In addition, the other end of the first portion 351 of the third waveguide 350 may be spaced apart from the other end of the first portion 331 of the first waveguide 330 by a predetermined distance to face each other.

A third slot 355 is formed on a bottom surface of the first portion 351. The third slot 355 may be provided as a through slit passing through the bottom surface of the first portion 351. Optionally, the third slot 355 may be filled with a material that transmits a third microwave to be described below. The longitudinal direction, arrangement, and/or shape of the third slot 355 may be provided to be mostly similar to that of the first slot 335. Accordingly, the description of the longitudinal direction, arrangement, and/or shape of the third slot 355 will be omitted to avoid the description of the duplicated contents.

The second portion 352 may extend from the first portion 351. For example, the second portion 352 may extend upwards from the upper surface of the first portion 351. The second portion 352 may be positioned on a virtual straight line passing through the center of the transmission plate 310. For example, the second portion 332 of the first waveguide 330 may be positioned to face the second portion 352 of the third waveguide 350 on the virtual straight line.

The third portion 353 may extend from the second portion 352. For example, the third portion 353 may extend from the upper surface of the second portion 332 in a vertical direction. The third portion 353 may be connected to a third power supply 390 to be described below.

The power supply 360 may include a first power supply 370, a first matching network 372, a second power supply 380, a second matching network 382, a third power supply 390, and a third matching network 392. The first power supply 370 and the first matching network 372 are provided similarly to the configuration described with reference to FIGS. 2 to 4.

The second power supply 380 generates a second microwave. The second power supply 380 may be connected to the second waveguide 340. For example, the second microwave generated by the second power supply 380 may have a frequency of approximately 0.8 GHz to 1.2 GHz. The second matching network 382 is provided in the second waveguide 340. The second matching network 382 is provided between the second power supply 380 and the second waveguide 340. The second matching network 382 may match the second microwave transmitted through the second power supply 380 with a predetermined frequency.

The third power supply 390 generates a third microwave. The third power supply 390 may be connected to the third waveguide 350. For example, the third microwave generated by the third power supply 390 may have a frequency of approximately 2.3 GHz to 2.5 GHz. The third matching network 392 is provided in the third waveguide 350. The third matching network 392 is provided between the third power supply 390 and the third waveguide 350. The third matching network 392 may match the third microwave transmitted through the third power supply 390 with a predetermined frequency.

The first microwave generated from the first power supply 370 may have a first intensity. The second microwave generated from the second power supply 380 may have a second intensity. In addition, the third microwave generated from the third power supply 390 may have a third intensity. The first intensity, the second intensity, and the third intensity may have different sizes. Optionally, the first intensity and the third intensity may have sizes corresponding to each other, and the second intensity may have a smaller size than the first intensity and the third intensity.

According to the exemplary embodiment of the present invention described above, the first waveguide 330 and the third waveguide 350 different from each other are disposed in the upper edge region of the transmission plate 310, and the second waveguide 340 is disposed in the region including the center of the transmission plate 310, thereby uniformly transmitting the microwaves to the treating space 101 from each waveguide 320. In addition, independent microwave sources (e.g., the first power supply 370, the second power supply 380, and the third power supply 390) are connected to the first waveguide 330, the second waveguide 340, and the third waveguide 350 to control different sizes of microwaves to be supplied according to the size of plasma formed for each region of the treating space 101, thereby compensating for the uniformity of the plasma in the treating space 101.

Figure 11:
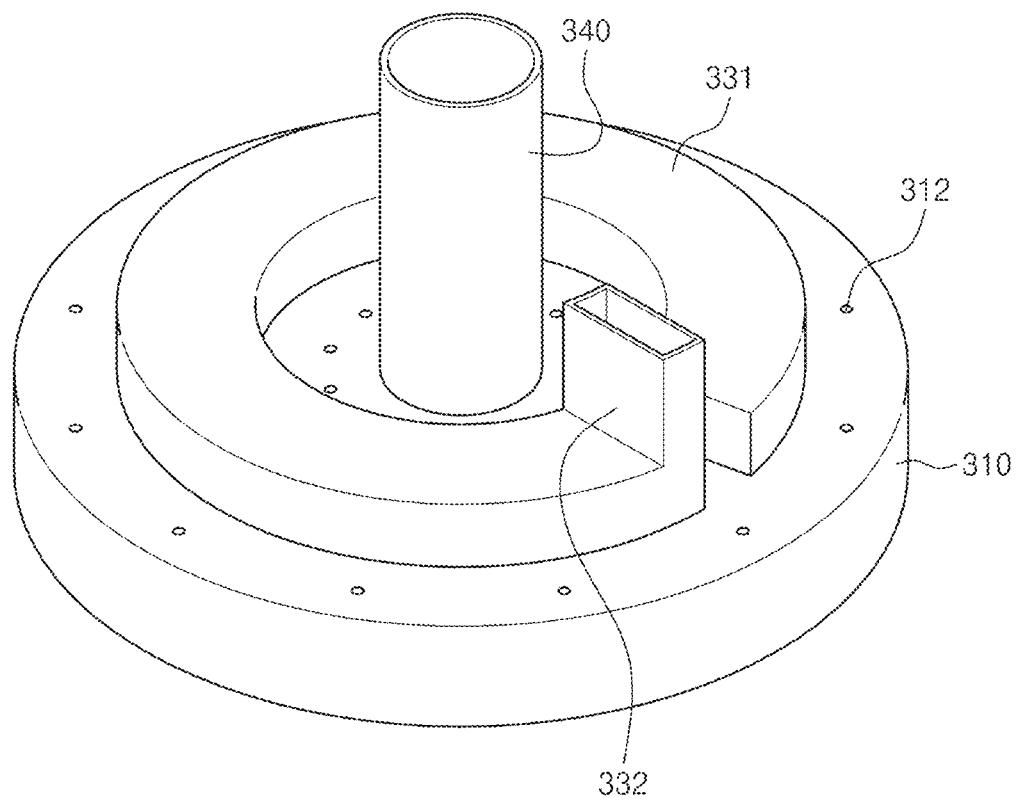
FIG. 11 is a diagram schematically illustrating a transmission plate and a waveguide according to another exemplary embodiment of FIG. 8.

FIG. 11 is a diagram schematically illustrating a transmission plate and a waveguide according to another exemplary embodiment of FIG. 8. Referring to FIG. 11, the waveguide 320 may include a first waveguide 330 and a second waveguide 340.

The first waveguide 330 may have a first portion 331, a second portion 332, and a third portion 333. The first portion 331, the second portion 332, and the third portion 333 may be integrally formed. The first portion 331 may be provided in a ring shape. The first portion 331 may have an annular ring shape with respect to the center of the transmission plate 310. The first portion 331 may be disposed at a position facing the edge region of the transmission plate 310 when viewed from the top. The first portion 331 is formed with a cut part. The first portion 331 may be provided in a discontinuous ring shape.

The second portion 332 may extend from the first portion 331. For example, the second portion 332 may extend upwards from the upper surface of the first portion 331. The second portion 332 may be coupled to the upper surface of the first portion 331 at a position adjacent to the cut surface formed in the first portion 331.

The third portion 333 may extend from the second portion 332. For example, the third portion 333 may extend from the upper surface of the second portion 332 in a horizontal direction. The third portion 333 may be connected to the first power supply 370.

The second waveguide 340 may be disposed in a region including the center of the transmission plate 310. For example, the second waveguide 340 may be disposed on an upper surface of the region including the center of the transmission plate 310. The second waveguide 340 may be disposed to be spaced apart from the first waveguide 330. A gas line 440 may be disposed in a space in which the first waveguide 330 and the second waveguide 340 are spaced apart from each other. Accordingly, a gas channel 312 may be formed on an upper surface of the transmission plate 310 facing a position in which the first waveguide 330 and the second waveguide 340 are spaced apart from each other. Accordingly, when viewed from the top, the gas channel 312 may be formed at a position that does not overlap with the first waveguide 330 and the second waveguide 340.

The foregoing detailed description illustrates the present invention. Further, the above content shows and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:

1. An apparatus for treating a substrate comprising:
a process chamber having a treating space therein;
a support unit configured to support the substrate in the treating space;
a gas supply unit configured to supply treating gas to the treating space; and
a microwave application unit configured to apply microwaves to the treating gas to generate plasma,
wherein the microwave application unit includes
a transmission plate disposed above the support unit and configured to radiate the microwaves to the treating space;
a first waveguide disposed above the transmission plate; and
a first power supply configured to apply the microwaves to the first waveguide,
wherein the first waveguide is provided in a discontinous ring shape partially surrounding a center of the transmission plate,
wherein the first waveguide is connected to the first power supply at a position spaced apart from the center of the transmission plate, when viewed from the top,
wherein the first waveguide is positioned to face an edge region of the transmission plate, and has a cut portion,
wherein the first power supply is coupled to one surface of the first waveguide adjacent to the cut surface of the first waveguide,
wherein a plurality of first slots are formed on a lower surface of the first waveguide, and
the first slots are spaced apart from each other along a circumferential direction of the first waveguide.

2. The apparatus for treating the substrate of claim 1, wherein the first slots are disposed in a plurality of rows when viewing the first waveguide from a front cross section.

3. The apparatus for treating the substrate of claim 1, wherein the microwave application unit further includes
a second waveguide disposed above the transmission plate in a region including the center of the transmission plate; and
a second power supply configured to apply the microwaves to the second waveguide,
wherein at least one or more second slots are formed on a lower surface of the second waveguide.

4. The apparatus for treating the substrate of claim 3, wherein the intensity of the microwave applied from the first power supply to the first waveguide is different from the intensity of the microwave applied from the second power supply to the second waveguide.

5. The apparatus for treating the substrate of claim 3, wherein a gas channel through which the treating gas flows is formed in the transmission plate, and the gas channel is formed at a position that does not overlap with the first waveguide and the second waveguide, when viewed from the top.

6. The apparatus for treating the substrate of claim 3, wherein the first waveguide is provided to surround a part of an upper edge region of the transmission plate, and wherein the microwave application unit further includes a third waveguide provided to surround the other part of the upper edge region of the transmission plate and combined with the first waveguide to form an annular ring shape, and having a plurality of third slots formed on a lower surface thereof; and a third power supply configured to apply the microwaves to the third waveguide.

7. The apparatus for treating the substrate of claim 1, wherein the first waveguide is provided with a metal material, and the transmission plate is provided with a material containing quartz.

8. An apparatus for treating a substrate comprising:

a chamber having a treating space formed therein;

a support unit configured to support the substrate in the treating space; and a microwave application unit configured to apply microwaves to treating gas supplied to the treating space to generate plasma, wherein the microwave application unit includes a transmission plate disposed above the support unit and configured to transmit a first microwaves to the treating space;

a first waveguide disposed above the transmission plate and in which the first microwave flows; and a first power supply configured to apply the first microwave to the first waveguide, wherein a plurality of first slots through which the first microwave flows is formed as the transmission plate on a lower surface of the first waveguide, and the first slots are spaced apart from each other along a circumferential direction of the first waveguide.

9. The apparatus for treating the substrate of claim 8, wherein the first slots are disposed in a plurality of ring shapes.

10. The apparatus for treating the substrate of claim 9, wherein the first waveguide is positioned to face an edge region of the transmission plate, and has a cut portion to be provided in a discontinuous ring shape.

11. The apparatus for treating the substrate of claim 10, wherein the microwave application unit further includes a second waveguide disposed above the transmission plate in a region including the center of the transmission plate; and a second power supply configured to apply a second microwave to the second waveguide, wherein at least one or more second slots are formed on a lower surface of the second waveguide.

12. The apparatus for treating the substrate of claim 11, wherein the first waveguide is provided to surround a part of an upper edge region of the transmission plate, and wherein the microwave application unit further includes a third waveguide provided to surround the other part of the upper edge region of the transmission plate and combined with the first waveguide to form an annular ring shape, and having a plurality of third slots formed on a lower surface thereof; and a third power supply configured to apply a third microwave to the third waveguide.

13. The apparatus for treating the substrate of claim 12, wherein the first waveguide, the second waveguide, and the third waveguide are in surface contact with the upper surface of the transmission plate, respectively.

14. The apparatus for treating the substrate of claim 12, wherein a gas channel through which the treating gas flows is formed in the transmission plate, and the gas channel is formed at a position that does not overlap with the first waveguide, the second waveguide, and the third waveguide, when viewed from the top.

15. An apparatus for treating a substrate comprising:

a process chamber having a treating space formed therein;

a support unit configured to support the substrate in the treating space;

a gas supply unit configured to supply treating gas to the treating space;

a transmission plate disposed above the support unit;

a first waveguide disposed above the transmission plate and having a plurality of first slots formed on a lower surface thereof;

a second waveguide disposed above the transmission plate in a region including the center of the transmission plate and having at least one or more second slots formed on a lower surface thereof;

a first power supply configured to apply a first microwave to the first waveguide; and a second power supply configured to apply a second microwave to the second waveguide, wherein the first waveguide has an annular ring shape with a cut portion.

16. The apparatus for treating the substrate of claim 15, wherein a gas channel through which the treating gas flows is formed in the transmission plate, and the gas channel is formed at a position that does not overlap with the first waveguide and the second waveguide when viewed from the top.

* * * * *